(12) United States Patent
Boe

(10) Patent No.: US 7,635,973 B2
(45) Date of Patent: Dec. 22, 2009

(54) ELECTRONIC COMPONENT HANDLER TEST PLATE

(75) Inventor: Gerald F. Boe, Newberg, OR (US)

(73) Assignee: Electro Scientific Industries, Inc., Portland, OR (US)

( * ) Notice: Subject to any disclaimer, the term of this patent is extended or adjusted under 35 U.S.C. 154(b) by 34 days.

(21) Appl. No.: 11/941,412

(22) Filed: Nov. 16, 2007

(65) Prior Publication Data

US 2009/0127169 A1     May 21, 2009

(51) Int. Cl.
     *G01R 31/28*     (2006.01)
(52) U.S. Cl. .................................... 324/158.1
(58) Field of Classification Search ........................ None
See application file for complete search history.

(56) References Cited

U.S. PATENT DOCUMENTS 5,842,579 A    12/1998    Garcia et al.
6,194,679 B1 *   2/2001    Garcia et al. ................. 209/571
6,313,654 B1    11/2001    Nansai et al.
6,573,739 B1    6/2003    Saito
6,710,611 B2    3/2004    Saulnier et al.

FOREIGN PATENT DOCUMENTS

JP     2000-046903     2/2000

\* cited by examiner

*Primary Examiner*—Vinh P Nguyen
(74) *Attorney, Agent, or Firm*—Young Basile

(57) ABSTRACT

An improved electronic component handler and associated improved test plate are shown. A guide on the test plate is used to intersect the testing apertures to eliminate misalignment of the component loading frame and the aperture to ensure easy insertion of components into the test apertures.

15 Claims, 3 Drawing Sheets

ELECTRONIC COMPONENT HANDLER TEST PLATE

FIELD OF THE INVENTION

This invention generally relates to electronic component handling devices and more specifically to improvements to electronic component handlers and testing plates.

BACKGROUND

Electronic components are handled by a wide variety of different electronic component handlers. These different handlers include, but are not limited to, products sold by Electro Scientific Industries, of Portland Oreg., the assignee of the present patent application. Electro Scientific Industries sells a variety of electronic component handlers including, but not limited to, a high volume MLCC tester sold as the model No. 3300, a chip array tester sold as the model No. 3400, a visual test system sold as the model No. 6650, and a chip array terminator sold as the model No. 753.

One such electronic component testing machine is described in prior art U.S. Pat. No. 5,842,579 entitled Electrical Circuit Component Handler. With reference to FIG. 2, included as FIG. 1 herein, there is shown an overall pictorial view of the electrical circuit component handler of U.S. Pat. No. 5,842,579 the entirety of which is incorporated herein by reference. FIG. 1 illustrates a handler 10 having support structure 14, an inclined planar surface 18, a turntable 20, a test plate 24 having a plurality of component test apertures 26 and a component loading area 28. A plurality of test accessories thereon including a loading frame 34, a contactor assembly 30 and a plurality of test modules 32. In operation, electronic components are fed into handler 10 through a hopper 44 and funnel 46 and are passed through load frame 34. The components to be tested are individually drawn into test apertures or seats 26 found on a test plate 24. The plurality of test apertures 26 are typically arranged in concentric rings that are continuous about test plate 20.

With more specific reference to loading frame 34, loading frame 34 includes a plurality of arcuate seating fences 40. Arcuate fences 40 guide and allow the electronic components to be collected adjacent the fences 40. Test plate 24 indexes in a clockwise direction toward test modules 32. Once in position, the electronic components are tested by test modules 32. Once testing is completed on each of the components, test plate 24 continues to index and the electronic component components are then withdrawn from the component handler 10.

With continued reference to U.S. Pat. No. 5,842,579, and referring to FIG. 3 herein, difficulties have been experienced in properly positioning the electronic components 50 in test apertures 26 in order to properly test the components. If the radially inward surfaces 70 of the seating fences 40, referred to herein as the load track functional surfaces, are not accurately aligned with the radially outer edge of the test apertures 26, the test components 50 may rest on a ledge 90 or portion of the test plate top surface 80 without dropping down into the test aperture 26 as is needed. To increase the probability of accurate location of the load track functional surface 70 with respect to the test apertures 26, very close tolerances need to be maintained which adds complexity and cost to the manufacturer and maintenance of the handler 10.

Other applications of the present invention will become apparent to those skilled in the art when the following description of the best mode contemplated for practicing the invention is read in conjunction with the accompanying drawings.

SUMMARY OF THE INVENTION

An improved electronic component and handler and test plate is provided. In one example of the improved test plate, a guide is positioned on the top surface of the test plate. The guide is preferably an angled surface extending from the top surface into at least a portion of the test aperture to eliminate a ledge in the top surface of the test plate below the load track surface to axially guide the test component into the test aperture.

In an alternate example of a test plate, the guide is a V-shaped groove. In one example, the groove is continuous about a radial path around the test plate intersecting a plurality of test apertures positioned in a concentric ring of test apertures. In an alternate example of the guide, the guide is also a V-shape, but is segmented and localized around the individual test apertures.

An improved electronic component handler is disclosed with the improved testing plate identified above.

A method of guiding an electronic test component into a test plate is also disclosed. The method included providing an improved test plate described above and conveying the electronic components to the load track surface and test plate guide for axial receipt of the component into the test aperture.

BRIEF DESCRIPTION OF THE DRAWINGS

The description herein makes reference to the accompanying drawings wherein like reference numerals refer to like parts throughout the several views, and wherein.

DETAILED DESCRIPTION

Referring to FIGS. 1-5 an improved electronic component handler and improved test plate are shown.

Figure 1:
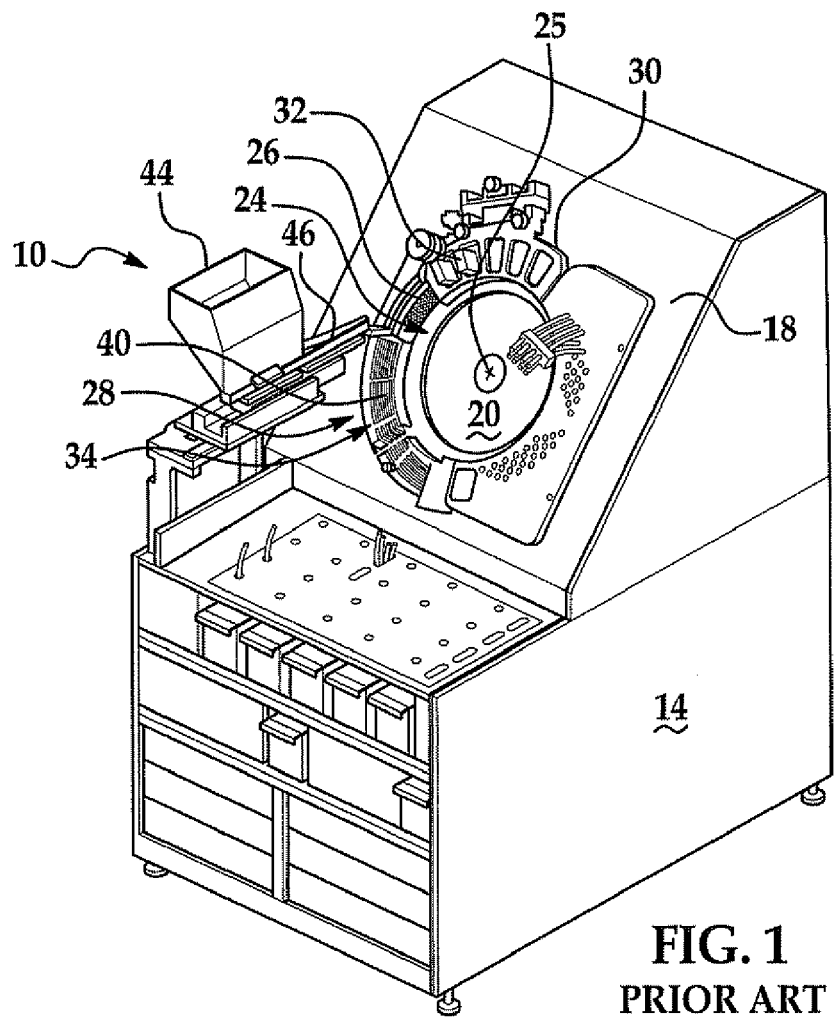
FIG. 1 is a perspective view of the prior art device in U.S. Pat. No. 5,842,579.
Figure 2:
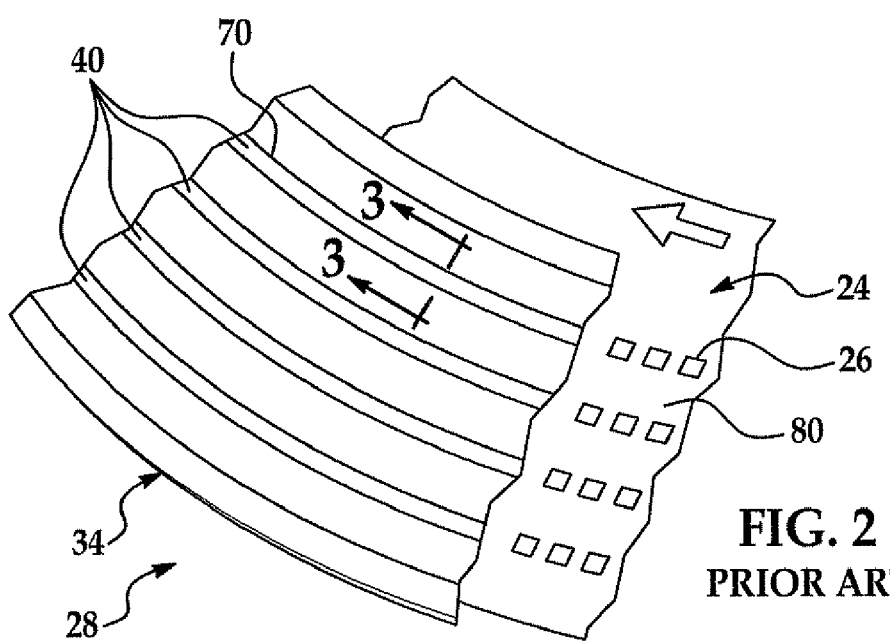
FIG. 2 is an enlarged partial perspective view of the loading area 28 in prior art FIG. 1.
Figure 3:
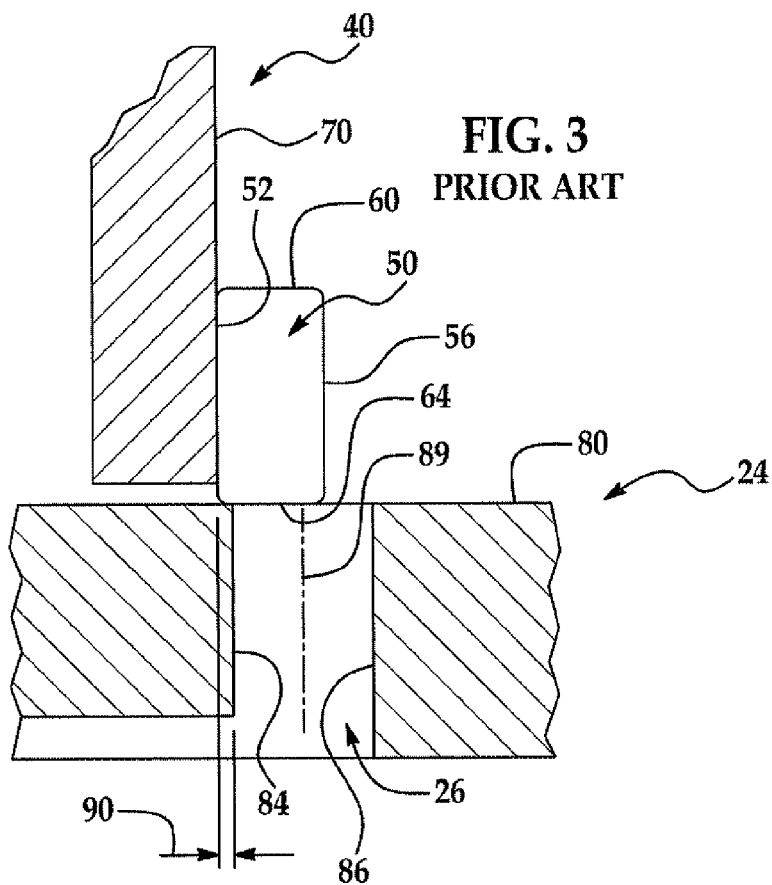
FIG. 3 is a enlarged cross sectional view taken along line 3-3 in prior art FIG. 2 of one of the arcuate.

Referring to FIGS. 1, 2 and 3, a known electronic component handler 10 corresponding to U.S. Pat. No. 5,942,579 assigned to Electro Scientific Industries, Inc., the assignee of the present invention, is generally shown. Handler 10 general includes a support structure 14, an inclined planar surface 18, a test plate 24 having a plurality of concentric test apertures or seats 26. Handler 10 further includes a contactor assembly 30 having several test modules 32 in radial and angular alignment with test apertures 26 as generally shown. Handler 10 generally includes a loading area 28 wherein a loading frame 34 is located and employed to distribute electrical components 50 to be tested toward test plate 24 by a hopper 44 and funnel 46.

Loading frame 34 includes several arcuate-shaped seating fences 40 for receipt and segregation of components 50 toward testing apertures 26 as further described below. On loading of a plurality of electrical components 50 into loading frame 34 and seating fences 40, the electrical components 50 are gravity fed around the radially inward surfaces of the respective seating fences 40 toward the lower portion of planar surface 18, and the loading area 28 adjacent the plurality of testing apertures 26.

As best seen in FIG. 3 the prior handler devices have experienced difficulty in that the inward facing surfaces of seating fences 40, referred to as load track functional surface 70 is subject to misalignment of the track functional surface 70, with respect to the inner walls of testing apertures 26, and more specifically to the radially outward wall 84. This misalignment of load track functional surface 70 and test aperture outer wall 84 may produce a ledge 90 whereon test components 50 may rest or hang up on ledge 90 preventing the component 50 from easily dropping into the test apertures 26 as intended. This leads to inefficiencies in the seating of components 50 and the subsequent testing of such components that do not properly seat in test aperture 26.

This difficulty in prior art handlers has attempted to be addressed through substantial tightening of the tolerances of the radial locations of the load track functional surfaces 70 with respect to the test plate 24 which creates complexity in the manufacturing of the handler 10 as well as increased cost in manufacturing and maintenance and operation.

Figure 4:
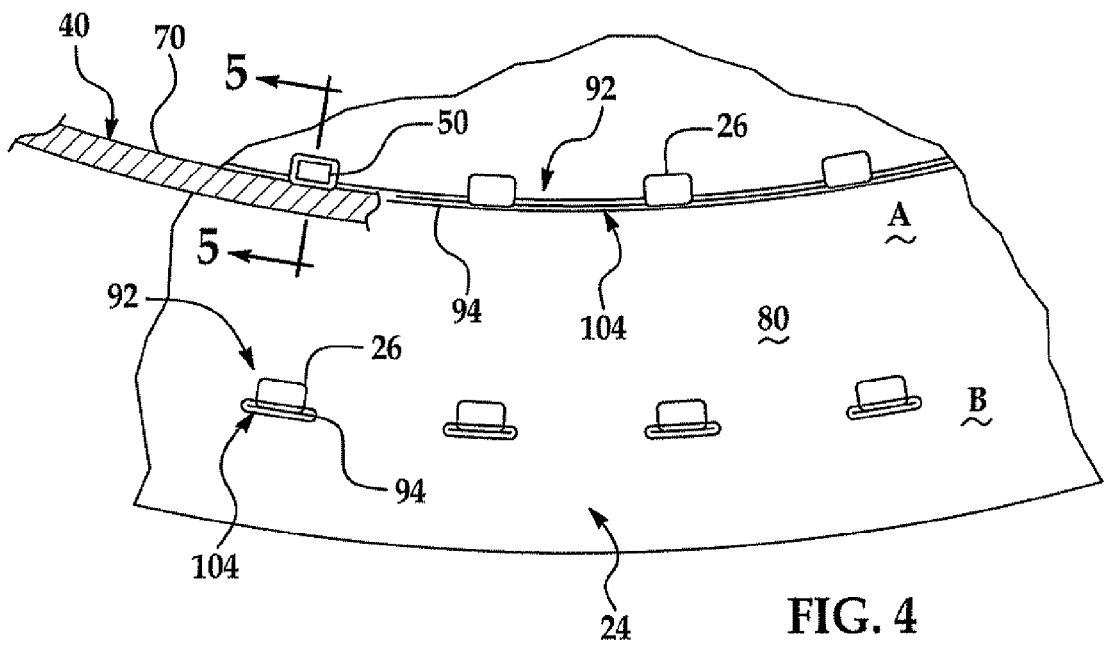
FIG. 4 is a partial schematic view of the test plate with two alternate examples of the improved test plate and guide.
Figure 5:
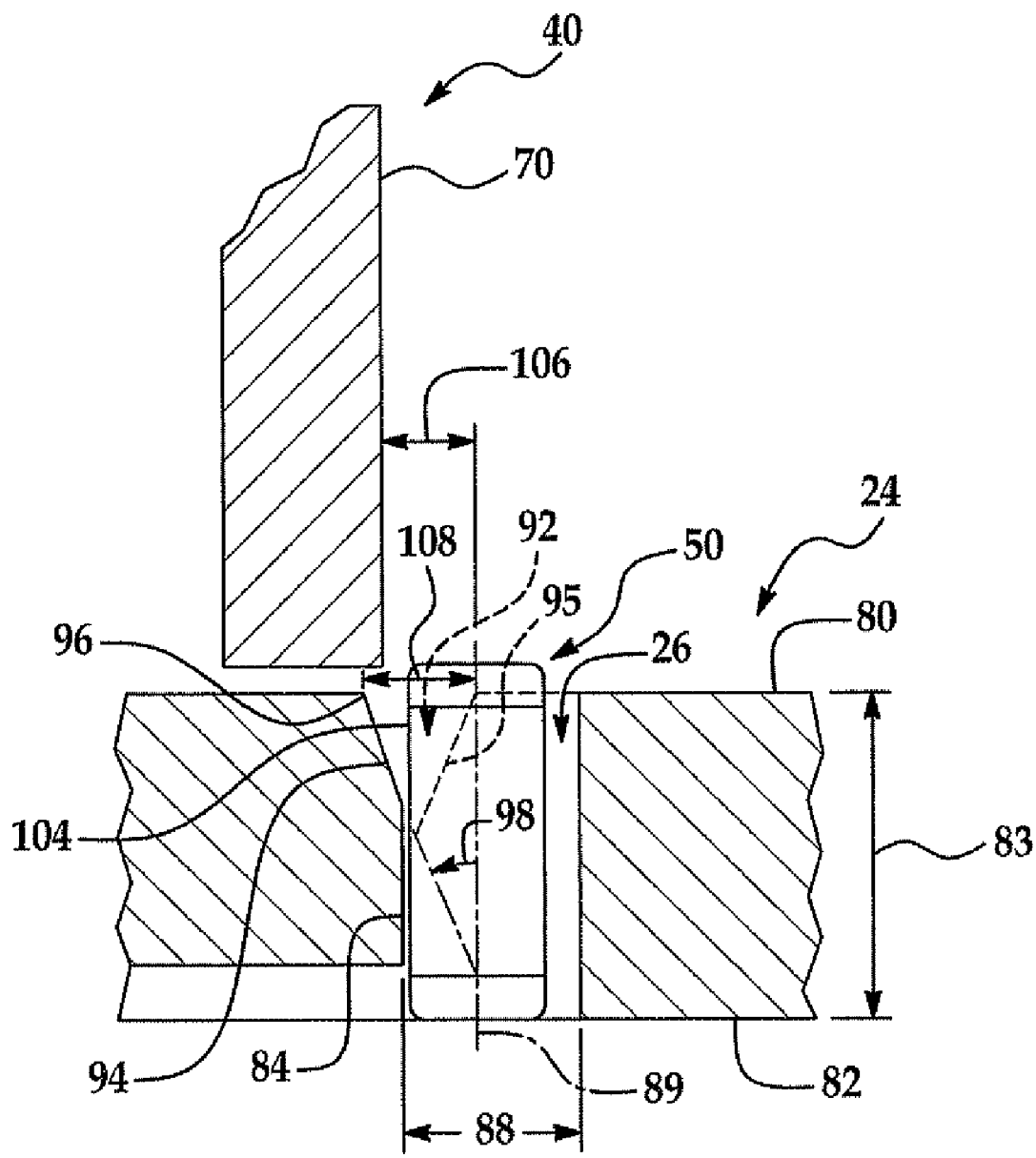
FIG. 5 is enlarged cross sectional view taken along line 4-4 in FIG. 3.

Referring to FIGS. 4 and 5, and improved test plate 24, for an exemplary use in electrical component handler 10, is illustrated. Referring to FIG. 4, two alternate examples of the present invention are illustrated. As described above, test plate 24 includes a top surface 80 having a plurality of test apertures 26 in radially concentric groups, angularly spaced apart about a central axis 25 (identified in FIG. 2) as generally shown. In one aperture 26, an exemplary electronic component 50 is shown properly positioned in test aperture 26.

Referring to FIGS. 4 and 5, the improved test plate 24, in an exemplary use in handler 10 having a seating fences 40 is generally illustrated. In a preferred example, test plate 24 includes a guide 92 having a first guide surface 94 and an opposing second guide surface 95 that is in communication with test aperture 26. In a preferred example, first guide surface 94 is an angled surface beginning from top surface 80 and extending angularly downward and radilly inward into at least a portion of aperture 26. In a preferred example, first guide surface 94 is positioned at an angle 98 of about 15 degrees from axis 89 of aperture 26 as shown. A range of about 5 to 45 degrees is believed to be suitable for angle 98. It is understood that angle 98 may vary depending on many factors including the type of component 50 to be tested, the angle of planar surface 18 of handler 10 and other manufacturing and operational characteristics as known by those skilled in the art.

In a preferred example, guide 92 includes a V-shaped groove 104, as shown in FIG. 5. Although shown in a V-shaped form, it is understood that guide 92 and groove 104 may take many shapes and forms such that the guide surface 94, guide groove 104 or other deformations or additions, substantially eliminates any ledge 90 (shown in FIG. 3) and facilitates axial entry of component 50 into test aperture 26 as shown in FIG. 5.

As generally shown in FIG. 5, first guide surface 94 preferably intersects with top surface 80 at a rim 96. In a preferred example, load track surface 70 is positioned at a first radial distance 106 from aperture 26 centerline axis 89. Rim 96 is further preferably positioned at a second radial distance 108 such that second radial distance 108 is greater in length than first radial distance 106 to ensure that no ledge 90 is produced that may catch or hang up component 50 from dropping into test aperture 26.

Guide 92, in the form of an angled guide surface 94 or groove 104, may be machined into test plate top surface 80 by conventional methods such as milling, turning, molding or other operations known by those skilled in the art. Guide 92 and rim 96 may further be a protrusion extending above top surface 80 (not shown).

Referring to FIG. 4, two alternate examples of guides 92 are shown. In the first example, marked A, guide 92 is in the form of a continuous V-shaped groove 104 which extends radially about test plate top surface 80 intersecting all of the test apertures for a respective concentric ring of apertures. In the alternate example, marked B, guide 92, in the form of a C-shaped groove 104 is segmented such that groove 104 exists only locally by each aperture 26. Alternate shaped grooves may be used without deviating from the present invention.

In a preferred method of guiding an electrical component, preferably an electronic chip, into a test plate testing aperture 26, a loading frame 34, load track surface 70, and improved test plate 24 are provided. Test plate 24 includes a guide radially positioned to intersect at least one of the test apertures to axially guide the chip into test aperture 26 as previously described for further processing.

While the invention has been described in connection with what is presently considered to be the most practical and preferred embodiment, it is to be understood that the invention is not to be limited to the disclosed embodiments but, on the contrary, is intended to cover various modifications and equivalent arrangements included within the spirit and scope of the appended claims, which scope is to be accorded the broadest interpretation so as to encompass all such modifications and equivalent structures as is permitted under the law.

What is claimed is:

1. An electrical component test plate for axial receipt of an electrical component that abuttingly engages a load track surface, the test plate comprising:
   a top surface and a bottom surface defining a thickness and a component test aperture for partial axial receipt of an electronic component in the aperture; and
   a guide in communication with the aperture for axially guiding the component into the aperture;
   wherein the guide comprises a guide surface extending angularly downward and radially inward from the top surface into at least a portion of the component aperture.

2. The test plate of claim 1 wherein the guide surface angle is in a range of about 5 to 45 degrees from a centerline axis in the aperture.

3. The test plate of claim 1 wherein the guide surface comprises a groove intersecting at least a portion of the component aperture at the top surface of the test plate to enlarge the width of at least a portion of the aperture.

4. The test plate of claim 3 wherein the guide surface groove is a V-shaped.

5. The test plate of claim 4 wherein the groove intersects a radially outward wall of the aperture.

6. The test plate of claim 3 wherein the groove is continuous along the top surface intersecting a plurality of concentric angularly spaced test apertures.

7. The test plate of claim 1 wherein the guide surface intersects the top surface forming a rim, the rim positioned radially outwardly of the load track surface.

8. An improved electrical component handler for testing electronic chips having a chip feeder, a loading frame and test plate having a plurality of test apertures for axial receipt of individual chips in the apertures, the improvement comprising:

a load track surface defined by the loading frame positioned a first radial distance from a centerline axis of the aperture; and a guide intersecting the top surface of the test plate forming a rim, the rim positioned a second axial distance from the aperture axis, wherein the guide assists in the axial receipt of the chip in the aperture, wherein the second radial distance of the rim is greater than the first radial distance of the load track surface with respect to the aperture axis.

9. The improvement of claim 8 wherein the guide comprises a guide surface extending from the top surface angularly downward and radially inward into at least a portion of at least one of the plurality of apertures.

10. The improvement of claim 9 wherein the guide surface is angled about 15 degrees with respect to the aperture axis.

11. The improvement of claim 9 wherein the guide surface comprises a V-shaped groove.

12. The improvement of claim 11 wherein the groove is continuous along a radial path about the top surface of the test plate intersecting the plurality of apertures positioned in a concentric ring and angularly spaced from one another.

13. An improved electrical component handler for testing electronic chips having a chip feeder, a loading frame and test plate having a plurality of test apertures for axial receipt of individual chips in the apertures, the improvement comprising:

a chip loading guide extending from a top surface of the test plate downwardly into the test plate toward a bottom surface of the test plate, the guide having a first guide surface and an opposing second guide surface, the guide intersecting at least one of the plurality of apertures to facilitate axial receipt of the chip in the at last one aperture, wherein the test plate includes a radially outward wall defining a portion of the at least one aperture, wherein the first guide surface intersects the radially outward wall.

14. The improvement of claim 13 wherein the first guide surface intersects the top surface forming a rim, wherein the rim is positioned radially outward from a load track surface defined by loading frame.

15. A method of guiding an electronic test component into one of a plurality of test apertures of a rotatable test plate for use in testing a plurality of test components, the method comprising:

conveying the test components to a position in abutting engagement with an arcuate loading frame defining at least one load track surface spaced radially outward from the plurality of test apertures, the load track surface positioned such that at least one test component is adjacent to at least one test aperture of the plurality of test apertures, the plurality of test apertures positioned in a concentric ring angularly spaced from one another with each test aperture having a centerline axis; and guiding the at least one test component axially into the at least one test aperture through a guide groove in the top surface of the test plate in communication with the at least one test aperture, wherein at least a portion of the groove is radially positioned outward of the load track surface to eliminate the top surface of the test plate directly below the load track surface.

* * * * *